United States Patent
Gerna et al.

(10) Patent No.: US 10,041,983 B2
(45) Date of Patent: Aug. 7, 2018

(54) VDS EQUALIZER OFFSET COMPENSATION FOR A CURRENT SENSE CIRCUIT

(71) Applicant: Dialog Semiconductor (UK) Limited, London (GB)

(72) Inventors: Danilo Gerna, Leghorn (IT); Stefano Scaldaferri, Bientina (IT); Nicolo Nizza, Marsala (IT)

(73) Assignee: Dialog Semiconductor (UK) Limited, London (GB)

( * ) Notice: Subject to any disclaimer, the term of this patent is extended or adjusted under 35 U.S.C. 154(b) by 390 days.

(21) Appl. No.: 14/838,266

(22) Filed: Aug. 27, 2015

(65) Prior Publication Data

US 2016/0266178 A1 Sep. 15, 2016

(30) Foreign Application Priority Data

Mar. 12, 2015 (DE) .......... 10 2015 204 518

(51) Int. Cl.
*G01R 19/00* (2006.01)
*H03F 3/45* (2006.01)

(52) U.S. Cl.
CPC ..... *G01R 19/0092* (2013.01); *H03F 3/45475* (2013.01); *H03F 2203/45551* (2013.01);
(Continued)

(58) Field of Classification Search
CPC ....... G01R 19/00; G01R 19/0092; H03F 3/00; H03F 3/45475; H03F 2203/00;
(Continued)

(56) References Cited

U.S. PATENT DOCUMENTS

| 4,885,477 A * | 12/1989 | Bird ..................... H03F 3/45076 |
| | | 323/316 |
| 8,198,937 B1 * | 6/2012 | Vilas Boas ......... H03F 3/45475 |
| | | 330/258 |

(Continued)

FOREIGN PATENT DOCUMENTS

DE  3855506  3/1997

OTHER PUBLICATIONS

German Search Report and English Translation 10 2015 204 518.8, Oct. 28, 2015.

*Primary Examiner* — Lincoln Donovan
*Assistant Examiner* — David Mattison
(74) *Attorney, Agent, or Firm* — Saile Ackerman LLC; Stephen B. Ackerman

(57) ABSTRACT

A current sense circuit for a pass transistor is described. The current sense circuit comprises a sense transistor, a differential amplifier comprising a differential input and a differential output, and a differential difference amplifier, referred to as DD amplifier, comprising a main differential input, an auxiliary differential input and an output; wherein the differential output of the differential amplifier is coupled to the auxiliary differential input of the DD amplifier; wherein the output port of the pass transistor is coupled to a first port of the main differential input and wherein the output port of the sense transistor is coupled to a second port of the main differential input. The output of the DD amplifier is used to control a voltage drop across the sense transistor and the pass transistor.

24 Claims, 8 Drawing Sheets

(52) U.S. Cl.
CPC .............. *H03F 2203/45634* (2013.01); *H03K 2217/0027* (2013.01); *H03K 2217/0054* (2013.01)

(58) Field of Classification Search
CPC   H03F 2203/45551; H03F 2203/45634; H03K 2217/00; H03K 2217/0027; H03K 2217/0054; H03K 17/00; H03K 17/04123; H03K 17/063; H03K 17/168; H03K 17/687; H03K 17/6871; H03K 17/6874
USPC ........................................................ 327/434
See application file for complete search history.

(56) References Cited

U.S. PATENT DOCUMENTS

| | | | |
|---|---|---|---|
| 2007/0222505 A1* | 9/2007 | Larson | ................ H03F 3/45995 330/9 |
| 2007/0222514 A1 | 9/2007 | Koike | |
| 2008/0122536 A1* | 5/2008 | Theus | ..................... H03F 1/486 330/253 |

* cited by examiner

VDS EQUALIZER OFFSET COMPENSATION FOR A CURRENT SENSE CIRCUIT

TECHNICAL FIELD

The present document relates to a circuit for sensing the current through a pass transistor.

BACKGROUND

Current sensing circuits are widely used for sensing and for controlling/regulating the current that flows through a pass transistor. The current sensing circuits typically comprise a sense transistor which is controlled using the same control signal as the pass transistor. The sense transistor is typically a scaled down copy of the pass transistor.

In order to ensure that the current through the sense transistor is an accurate indication of the current through the pass transistor, the voltage drop across the sense transistor should match the voltage drop across the pass transistor.

SUMMARY

The present document addresses the technical problem of providing an accurate indication of the current through a pass transistor. In this context, measures for matching the voltage drop across a sense transistor with the voltage drop across the pass transistor are described. According to an aspect, a current sense circuit (or a current sense and regulation circuit) for a pass transistor is described. The pass transistor may comprise a metal oxide semiconductor (MOS) transistor, e.g. a p-type MOS transistor. The current sense circuit comprises a sense transistor (e.g. a MOS transistor, notably a MOS transistor of the same type as the pass transistor) having an input port (e.g. a drain or a source) that is coupled to an input port (e.g. a drain or a source) of the pass transistor and having a control port (e.g. a gate) that is coupled to a control port (e.g. a gate) of the pass transistor. A size of the pass transistor may be greater than a size of the sense transistor by 2, 3 or more orders of magnitude. As such, a current through the pass transistor may be greater than a current through the sense transistor in accordance to the size ratio of the sizes of the pass transistor and of the sense transistor.

The current sense circuit further comprises a differential amplifier which comprises a differential input and a differential output. An output port (e.g. a source or a drain) of the pass transistor may be coupled to a first port of the differential input and an output port (e.g. a source or a drain) of the sense transistor may be coupled to a second port of the differential input. As such, a delta voltage corresponding to the difference between a pass voltage at the output port of the pass transistor and a sense voltage at the output port of the sense transistor may be amplified by the differential amplifier, to provide a second delta voltage at the differential output of the differential amplifier.

Furthermore, the current sense circuit comprises a differential difference amplifier, referred to as DD amplifier, which comprises a main differential input, an auxiliary differential input and an output. The differential output of the differential amplifier may be coupled to the auxiliary differential input of the DD amplifier. Furthermore, the output port of the pass transistor may be coupled to a first port of the main differential input and the output port of the sense transistor may be coupled to a second port of the main differential input. In other words, the delta voltage may be coupled to the main differential input of the DD amplifier.

The output of the DD amplifier may be used to control a voltage drop across the sense transistor and across the pass transistor. In particular, the $V_{DS}$ across the pass transistor and across the sense transistor may be controlled using the output of the DD amplifier. In particular, the voltage level at the gates of the sense transistor and of the pass transistor may be controlled based on the output of the DD amplifier. Alternatively or in addition, the supply voltage at the input ports of the sense transistor and of the pass transistor may be controlled based on the output of the DD amplifier (e.g. using a DC-DC power converter). In the latter case, the gates of the sense transistor and of the pass transistor may be maintained at a fixed level (e.g. ground).

By using a DD amplifier in combination with a differential amplifier, an accurate compensation of the amplifier offsets may be achieved, thereby enabling an accurate $V_{DS}$ equalization and by consequence an accurate measurement of the current through the pass device. This is the case in particular if a differential amplifier is used, which exhibits an offset compensation or which exhibits a relatively low offset.

The current sense circuit may comprise an output transistor (e.g. a MOS transistor) which is controlled by the output of the DD amplifier. In particular, the voltage at the output of the DD amplifier may be applied to a control port (e.g. a gate) of the output transistor. An output port (e.g. a source or a drain) of the output transistor may be coupled to the output port of the sense transistor, thereby providing a feedback loop for equalizing the voltage drop (e.g. the $V_{DS}$) across the pass transistor and the sense transistor. The current through the output transistor (referred to herein as the sense current) provides an indication of the current through the pass transistor.

The sense current through the output transistor may be fed back to the control ports of the pass transistor and of the sense transistor. In particular, the current sense circuit may comprise one or more current mirrors for mirroring the sense current to the control ports of the pass transistor and of the sense transistor. Furthermore, the current sense circuit may comprise a current source which is configured to set a control current. A voltage level at the control ports of the pass transistor and of the sense transistor may be dependent on the control current. Furthermore, the voltage level at the control ports of the pass transistor and of the sense transistor may be dependent on the mirrored sense current. In particular, a difference between the control current and the mirrored sense current may set the voltage level at the control ports of the pass transistor and of the sense transistor. As such, a regulation loop may be provided for regulating the current through the pass transistor in accordance to the control current.

The (e.g. fully) differential amplifier may comprise an offset compensated differential amplifier. As a result of this, the amplifier offsets of the current sense circuit may be further reduced, thereby increasing the accuracy of the sense current. In other words, the differential amplifier may be an amplifier with an offset compensation or an amplifier with a relatively low offset. By way of example, the differential amplifier may comprise a BJT (bipolar junction transistor) input transistor or an amplifier that comprises a relatively large amplifying device that leads to a relatively low offset.

In particular, the differential amplifier may comprise an analog-to-digital converter (e.g. a sigma delta ADC) configured to derive a digital signal from the delta voltage at the differential input of the differential amplifier. A dithering unit configured to apply a dither signal to the delta voltage may be used in case of a sigma delta ADC. Furthermore, the differential amplifier may comprise a digital filter configured to filter the digital signal, in order to provide a filtered signal. In addition, the differential amplifier may comprise a digital-to-analog converter which is configured to derive voltages at the differential output of the differential amplifier based on the filtered signal. As such, the differential amplifier may be implemented in the digital domain, thereby enabling a precise compensation of the offset of the differential amplifier, and thereby providing an accurate sense current.

Alternatively or in addition, the differential amplifier may comprise a first (differential) sub-amplifier and a second (differential) sub-amplifier that are arranged in parallel with regards to the differential input and the differential output of the differential amplifier. As such, both sub-amplifiers may comprise a differential input and a differential output, respectively. The first sub-amplifier and the second sub-amplifier may be operated in an auto-zero phase and in an amplification phase in an alternating manner. The alternation of the auto-zero phase and of the amplification phase may be controlled using a clock signal. As a result of this, the overall offset of the differential amplifier may be compensated in a precise manner, thereby enabling an accurate measurement of the current through the pass transistor.

In particular, the first sub-amplifier and the second sub-amplifier may be operated in the auto-zero phase in a mutually exclusive manner, such that the first sub-amplifier is in the amplification phase, when the second sub-amplifier is in the auto-zero phase, and such that the second sub-amplifier is in the amplification phase, when the first sub-amplifier is in the auto-zero phase. By doing this, it can be ensured that at least one of the (at least) two sub-amplifiers is always within the amplification phase. As a result of this, a continuous current sensing and regulation loop is provided, thereby enabling stable and accurate current sensing.

The differential amplifier may comprise auto-zero capacitors for the first sub-amplifier. In particular, an auto-zero capacitor may be provided for each input port of the first sub-amplifier. The auto-zero capacitors may be arranged in series with the respective input ports of the first sub-amplifier, when the first sub-amplifier is in the auto-zero phase, thereby "storing" the offset of the first sub-amplifier. Furthermore, the auto-zero capacitors may couple the respective input ports of the first sub-amplifier to ground, when the first sub-amplifier is in the amplification phase, thereby providing an accurate offset compensation. Auto-zero capacitors may also be provided for the second sub-amplifier.

The pass transistor may comprise a battery switch for providing or for controlling a charge current to a rechargeable battery. The current sense circuit may comprise a control current source which is configured to set a current through the battery switch for charging the rechargeable battery. Furthermore, the current sense circuit may comprise a DC-DC power converter which is configured to control a level of the supply voltage in dependence on the current provided by the control current source. Furthermore, the DC-DC power converter may be configured to control the level of the supply voltage in dependence on a difference between the output voltage of the pass transistor and the output voltage of the sense transistor. In particular, the DC-DC power converter may be configured to control the level of the supply voltage in dependence on the output of the DD amplifier.

According to a further aspect, a method for providing a sense current which is indicative of a current through a pass transistor is described. The method comprises arranging a sense transistor such that an input port of the sense transistor is coupled to an input port of the pass transistor and such that a control port of the sense transistor is coupled to a control port of the pass transistor. Furthermore, the method comprises amplifying a delta voltage corresponding to a difference between a pass voltage at an output port of the pass transistor and a sense voltage at an output port of the sense transistor to provide a second delta voltage. In addition, the method comprises amplifying the delta voltage and the second delta voltage using respective differential input ports of a differential difference amplifier, referred to as DD amplifier, to provide a differential output voltage. The method may comprise using an output of the DD amplifier to control a voltage drop across the sense transistor and the pass transistor. In particular, the method may comprise coupling an output port of an output transistor to the output port of the sense transistor. Furthermore, the method may comprise controlling the output transistor using the differential output voltage, wherein the sense current corresponds to the current through the output transistor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Power management functions, e.g. for battery charging, which make use of a pass transistor typically comprise a current sense circuit to sense and/or control the actual current sourced or sunk by external components. Integrated current sensing may be performed by means of a sense transistor which is a down-scaled copy of the pass transistor.

In order to reduce the charging time, battery chargers may require relatively high charging currents (of several Amperes). In this context, the voltage drop at the pass transistor (e.g. the $V_{DS}$ of a MOS transistor) is pushed as low as possible, in order to increase the system efficiency of the pass transistor. As a result of this, there is a need for implementing the current sense with a reduced offset voltage. Since in normal operation, the pass transistor is typically pushed into a deep linear region, the matching between the pass current (through the pass transistor) and the sense current (through the sense transistor) is strongly dependent on the matching of the voltages across the pass transistor and the sense transistor. In particular a mismatch in $V_{DS}$ of a pass transistor and of a sense transistor directly impacts a mismatch in the pass current and in the sense current.

The current $I_D$ through a MOS transistor is given by $$I_D = \mu C_{OX} W/L (V_{GS} - V_{TH} - V_{DS}/2) V_{DS}.$$

This can be simplified with $V_{GS} - V_{TH} \gg V_{DS}$ as $$I_D = \mu C_{OX} W/L (V_{GS} - V_{TH}) V_{DS}.$$

In the above formulas, $V_{GS}$ is the gate-source voltage at a MOS transistor, $V_{TH}$ is the threshold voltage of the MOS transistor, W/L is the width-to-length ratio of the MOS transistor, $C_{OX}$ is the capacitance of the oxide layer of the MOS transistor and $\mu$ is the charge-carrier effective mobility.

From the above formulas, it can be seen that the drain-source current $I_D$ through a MOS transistor is directly dependant on the drain-source voltage $V_{DS}$ across the MOS transistor. As a result of this, it is typically important to match the drain-source voltages across the pass transistor and across the sense transistor, in order to ensure that the sense current provides an accurate indication of the pass current.

Figure 1A:
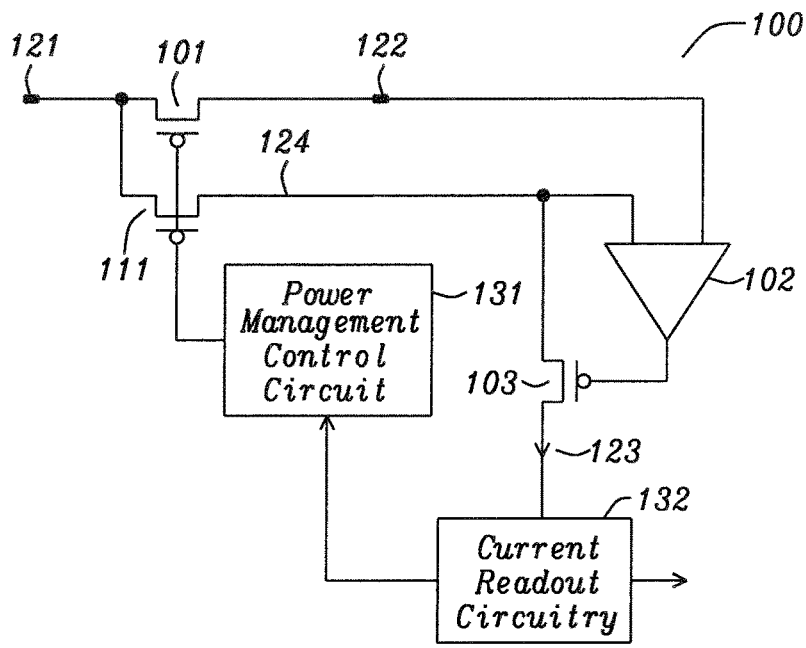
FIG. 1a shows a block diagram of an example current sense/current regulation circuit.

A block diagram of an example current sense and current control circuit 100 is illustrated in FIG. 1a. FIG. 1a shows the pass transistor 101 which is implemented as a p-type MOS transistor with the source being coupled (directly) to a supply voltage 121 and with the drain providing an output voltage 122 (e.g. a battery voltage for charging a battery). The pass transistor 101 is controlled via a gate. The sense transistor 111 is also implemented as a p-type MOS transistor which exhibits a width-to-length ratio that is typically smaller than the width-to-length ratio of the pass transistor 101 by a factor of 100, 1000 or more. The drain of the sense transistor 111 is also coupled (directly) to the supply voltage 121 and the gate of the sense transistor 111 is (directly) coupled to the gate of the pass transistor 101. The gates of the sense transistor 111 and of the pass transistor 101 are controlled using a control circuit 131 (e.g. a power management circuit).

The current sense and current control circuit 100 comprises a differential amplifier 102 which is configured to amplify a delta voltage at the input of the differential amplifier 102. The delta voltage corresponds to the difference between the output voltage 122 of the pass transistor 101 and the output voltage 124 of the sense transistor 111. The amplified delta voltage at the output of the amplifier 102 is fed back to one of the differential inputs of the differential amplifier 102 (and to the source of the sense transistor 111) via the output transistor 103. As a result of this, the output voltage 124 of the sense transistor 111 is regulated to be equal to the output voltage 122 of the pass transistor 101, thereby matching the $V_{DS}$ across the pass transistor 101 and the $V_{DS}$ across the sense transistor 111. The sense current 123 is provided by the output transistor 103 and via current readout circuitry 132.

Figure 1B:
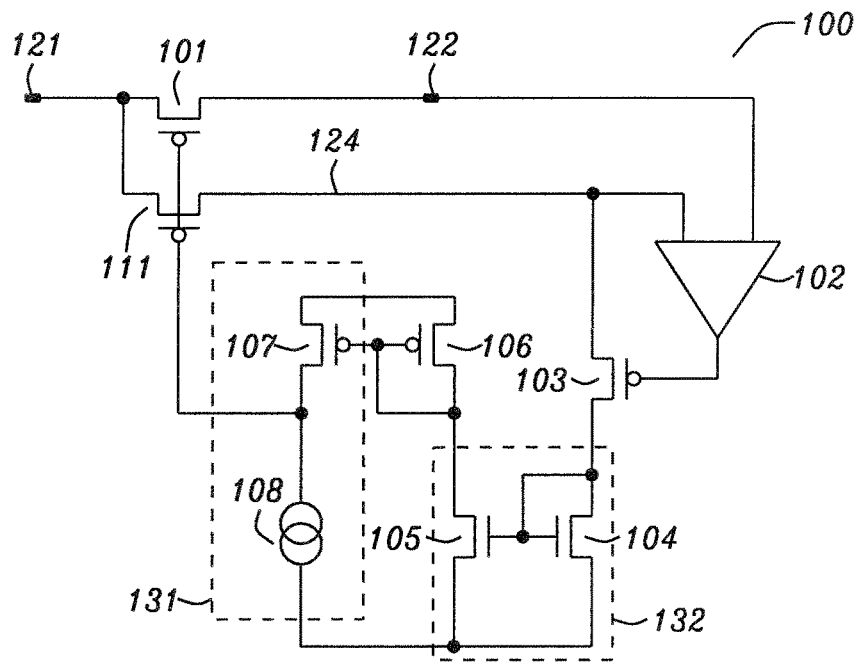
FIG. 1b shows a circuit diagram of an example current sense/current regulation circuit.

FIG. 1b shows a circuit diagram of a current sense and current control circuit 100. The circuit 100 comprises a first current mirror 104, 105 and a second current mirror 106, 107 for copying the sense current 123 to the gates of the sense transistor 111 and the pass transistor 101. The copied sense current is offset with a control current that is set by a current source 108, in order to control the gates of the sense transistor 111 and the pass transistor 101 and in order to set the current through the pass transistor 101 in accordance to the control current.

Operational amplifiers 102 typically exhibit an amplifier offset. This amplifier offset affects the precision of the sense current 123. Chopping or Correlated Double Sampling techniques may be applied to compensate such an amplifier offset. However, these techniques are difficult to apply in case of single ended differential amplifiers (as shown in FIG. 1a). Furthermore, chopping requires output offset ripple filtering which increases the complexity and/or which may cause disturbances at the chopping clock frequency that may affect the regulated output current. In addition, Correlated Double Sampling techniques suffer from high frequency aliasing and require a blind phase (i.e. offset sampling phase) implementing a sampled data regulated current.

The differential amplifier 102 should ideally have zero offset in order to improve the pass transistor 101 and the sense transistor 111 current matching. Furthermore, the main sensing/regulation loop should be continuous instead of having a discrete time topology. In addition, the current sense and current control circuit 100 should be robust to the aliasing of high frequency disturbances such that a residual offset of the differential amplifier 102 is not affected by injected noise.

Figure 2:
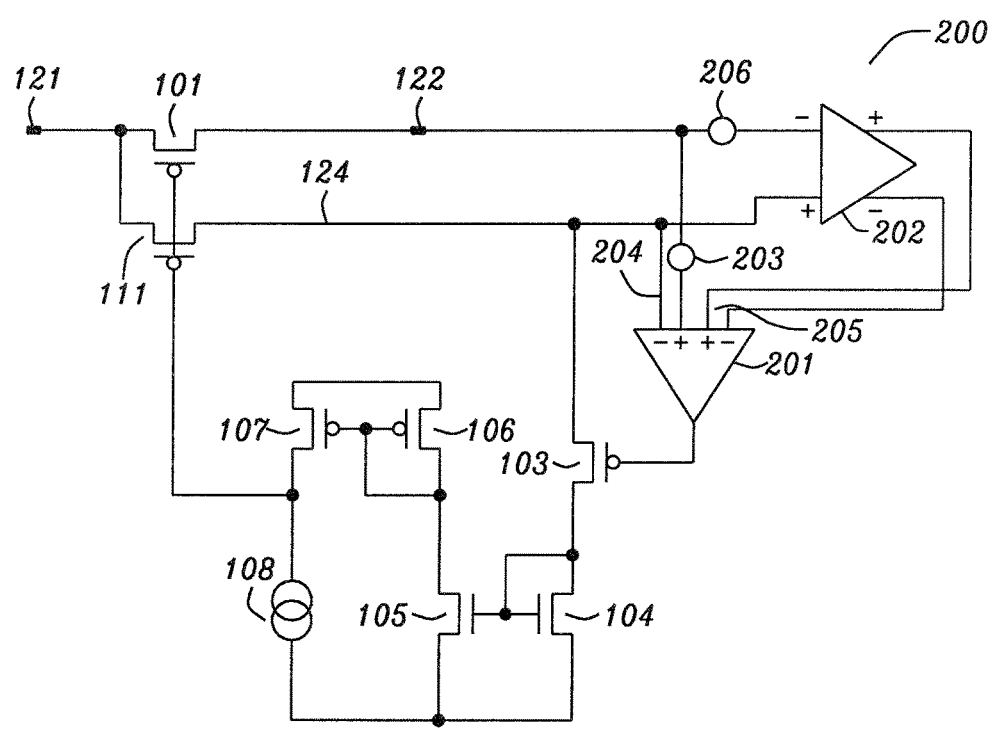
FIG. 2 shows a circuit diagram of an example current sense/current regulation circuit with offset compensation.

FIG. 2 shows a current sense and current control circuit 200 which comprises a Differential Difference Amplifier (DDA or DD amplifier) 201 that may be used in addition to a differential amplifier 202. The DDA 201 comprises two differential control ports 204 (the main port) and 205 (the auxiliary port). The main port 204 may be used to replace the differential amplifier 102 of FIG. 1b. The DDA offset 203 of this path is also shown in FIG. 2.

The auxiliary port 205 is coupled to a fully differential amplifier 202 which determines the main DC gain and offset of the current sensing/regulation loop. Apart from finite gain errors, the DDA offset 203 at the main port 204 may be compensated by the differential amplifier 202 which is coupled to the auxiliary port 205. $A_1$ is the gain of the differential amplifier 202 and $A_{main}$ and $A_{aux}$ are the input-output voltage gains for the DDA 201 with respect to its main port 204 and its auxiliary port 205, respectively. The residual offset is then given by $$Vos_{TOT} = V_{OFF} \times A_{main} / (A_{AUX} \times A_1) + Vos_{AMP},$$

where $V_{OFF}$ is the DDA offset 203 and where $Vos_{AMP}$ is the differential amplifier offset 206 of the differential amplifier 202. If the voltage gains of the main port 204 and of the auxiliary port 205 are matched (i.e. $A_{main} = A_{aux}$), the main amplifier offset can be expressed as:

$$Vos_{TOT} = V_{OFF}/A_1 + Vos_{AMP}.$$

Hence, the DDA offset 203 can be reduced by the gain $A_1$ of the differential amplifier 202. The differential amplifier offset 206 may be reduced by using e.g. an auto-zeroed differential amplifier 202.

The sensing/regulation loop of the circuit 200 of FIG. 2 is such that, if the delta voltage at the main port 204 and the delta voltage at the auxiliary port 205 are exactly the same and if the differential amplifier 202 and the DDA 201 have an infinite gain, and in case of a systematic offset 203 at the main port 204 of the DDA 201, the differential amplifier 202 loop reacts by showing the same DC amplitude of the DDA offset 203 but with opposite sign at the auxiliary port 205 of the DDA 201, thereby compensating the DDA offset 203.

The fully differential amplifier 202 can make use of discrete time auto-zero topologies. The advantage of the compensation loop of FIG. 2 is that the entire compensation loop it fully differential. A further advantage of using the arrangement of FIG. 2 is that the overall $V_{DS}$ equalizer amplifier gain of the differential amplifier 202 in combination with the DDA 201 remains constant, even if the differential amplifier 202 is implemented by two matched amplifiers working alternately (as outlined in the context of FIG. 3). The total amplifier gain is given by:

$$A_{TOT}=A_{MAIN}+A_1 \times A_{AUX}.$$

As indicated above, the differential amplifier 202 may be implemented by two amplifiers that work during two non-overlapping phases. During a first phase, the first amplifier may compensate its offset (i.e. the first amplifier may be in its auto-zeroing phase) and the other amplifier may be working as an amplifier within the sensing loop (i.e. the other amplifier may be in its amplification phase). During a second phase, the situation may be vice versa. By making use of a differential amplifier 202 which comprises multiple amplifiers that are operated in different phases, the circuit 200 becomes robust against noise. It should be noted, however, that other offset compensation schemes adopting an auto-zero topology may be used to compensate the differential amplifier offset 206.

Figure 3:
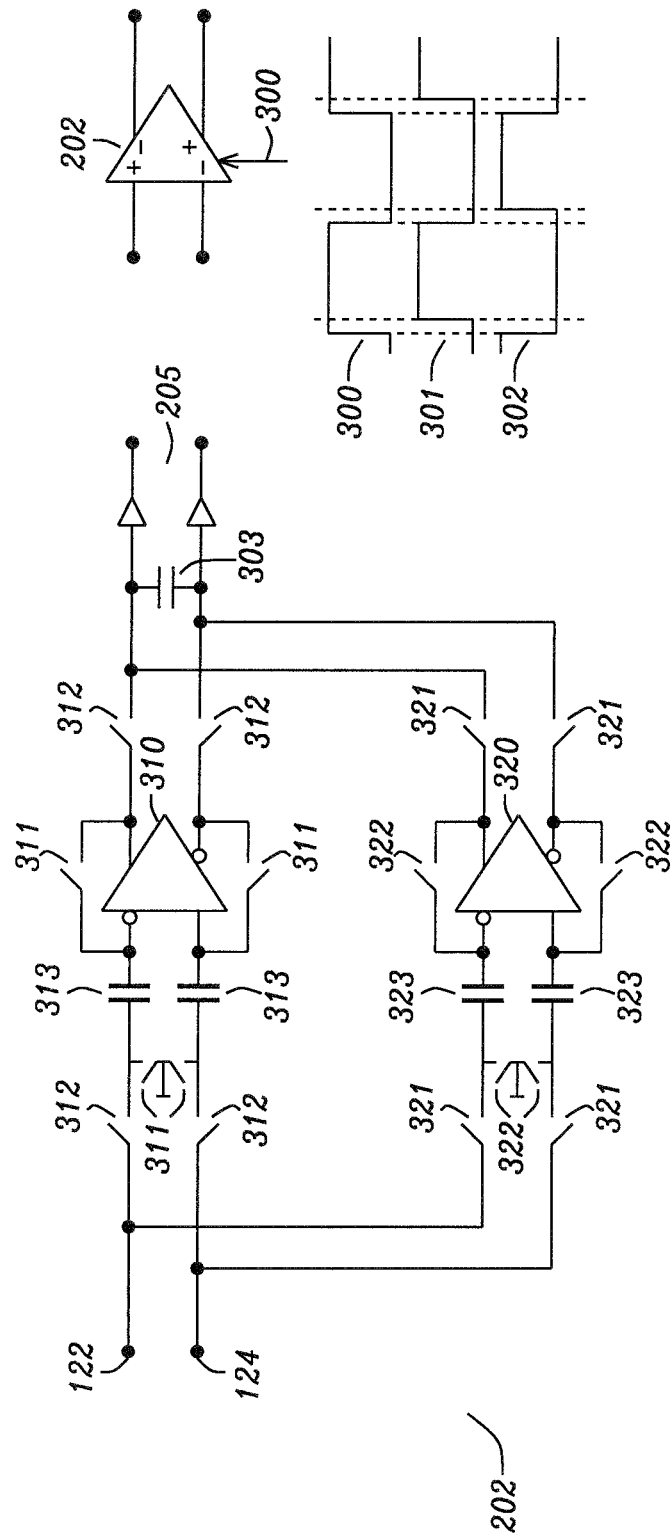
FIG. 3 shows a circuit diagram of a multi auto-zero amplifier.

FIG. 3 shows a fully differential amplifier 202 which comprises two sub-amplifiers 310, 320 that are operated alternately in two different phases, an auto-zero phase and an amplification phase. The phases may be controlled using a master clock signal 300 from which a first clock signal 301 and a second clock signal 302 for controlling first switches 311, 321 and second switches 312, 322 of the sub-amplifiers 310, 320, respectively, may be derived. In particular, the first switches 311, 321 may be controlled using the first clock signal 301 and the second switches 312, 322 may be controlled using the second clock signal 302. The switches 311, 321, 312, 322 are closed, when the respective clock signal 301, 302 is high. On the other hand, the switches 311, 321, 312, 322 are opened, when the respective clock signal 301, 302 is low. It can be seen that the clock signals 301, 302 have non-overlapping phases, when the clock signals 301, 302 are high, thereby ensuring that the first switches 311, 321 and the second switches 321, 322 are closed in a mutually exclusive manner.

When the first clock signal 301 is high, the auto-zero capacitors 323 of the second sub-amplifier 320 are charged, i.e. the second sub-amplifier 320 is within the auto-zero phase. On the other hand, the auto-zero capacitors 313 of the first sub-amplifier 310 are used to compensate an offset of the first sub-amplifier 310 while the first sub-amplifier 310 is operated in the amplification phase. When the second clock signal 302 is high, the situation is vice versa.

It should be noted that the multi auto-zeroed amplifier 202 may comprise more than two sub-amplifiers 310, 320 which are operated in different phases. This may be advantageous for optimizing the power consumption.

Figure 4A:
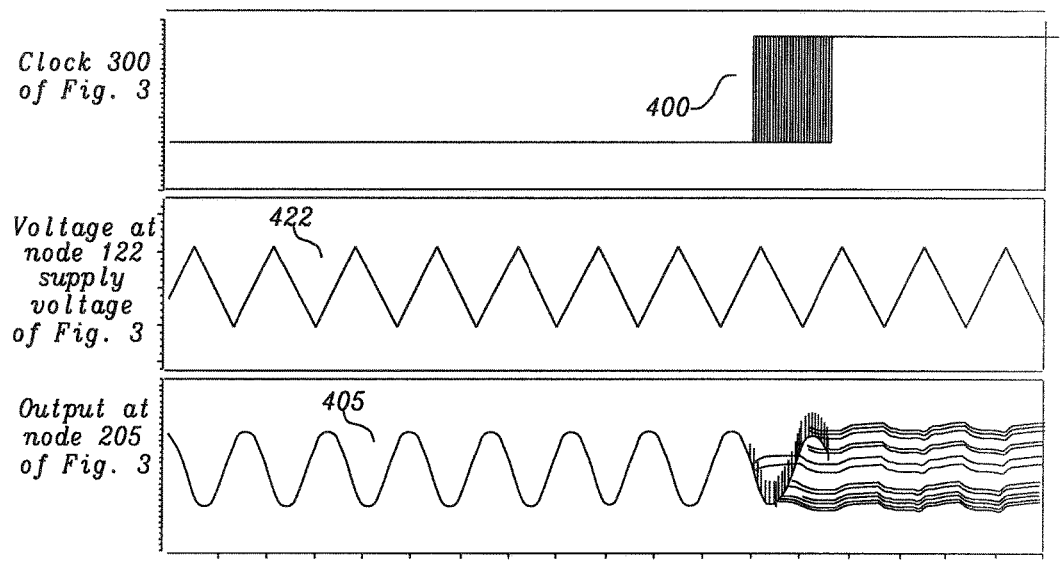
FIGS. 4a and 4b show simulation results.

FIG. 4a shows a simulation result for the operation of a current sense and regulation circuit 200 which comprises a differential amplifier 202 that comprises only a single auto-zeroed sub-amplifier. In this case, the output of the differential amplifier 202 is kept on hold during the auto-zero compensation phase of the sub-amplifier. FIG. 4a shows the clock signal 300, 400 (as a function of time) which is applied to the differential amplifier 202 for alternating the sub-amplifier between the auto-zero compensation phase and the amplification phase. Furthermore, FIG. 4a shows the noise superimposed onto the supply voltage 122, 422. The noise may be due to a switched power converter that is used to generate the supply voltage 122, 422, therefore exhibiting noise with a frequency that corresponds to the commutation cycle rate of the power converter. In addition, FIG. 4a shows the delta voltage 405 at the auxiliary port 205 of the DDA 201, i.e. at the output of the differential amplifier 202. The sampling errors that are caused by aliasing which is due to the random phase difference between the auto-zero sampling clock 400 and the noise superimposed to the supply voltage 405 can clearly be seen.

Figure 4B:
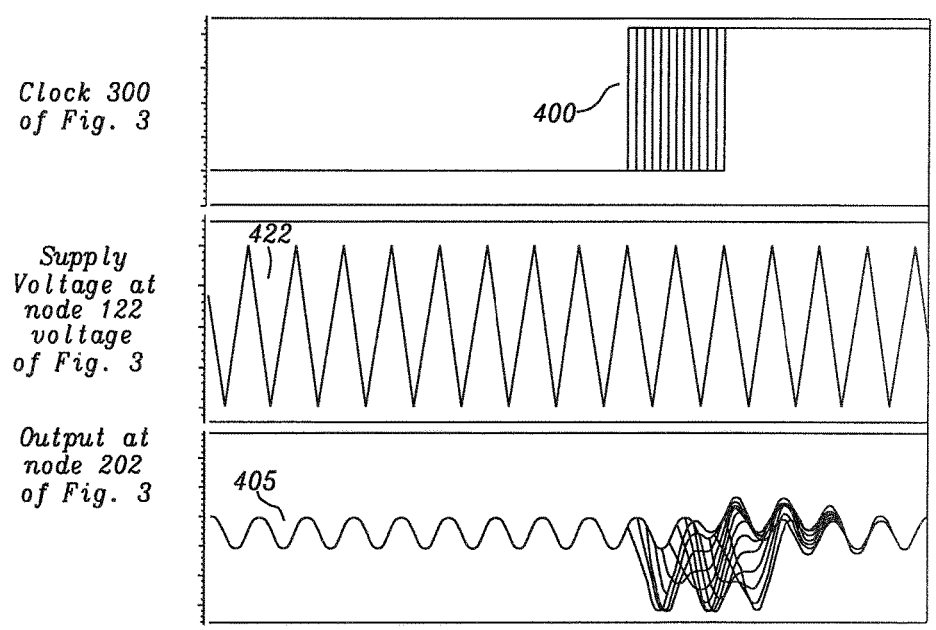

FIG. 4b shows the situation for a differential amplifier 202 which comprises two sub-amplifiers 310, 320 that are operated in an alternating manner. The output 405 of the differential amplifier 202 exhibits a distorted response depending on the moment at which the clock signal 400 toggles. However, the output 405 of the differential amplifier 202 recovers to the correct values after a few commutation cycles of the switched power converter that provides the supply voltage 122, 422.

As such, a current sensing/regulation circuit 200 is described which comprises a $V_{DS}$ equalizer that comprises a multi auto-zeroed differential amplifier 202 with a plurality of sub-amplifiers 310, 320. The use of a plurality of sub-amplifiers 310, 320 allows implementing a continuous and stable sensing/regulation loop, while at the same time providing offset compensation. As a result of this, accurate and stable current sensing/regulation may be provided. Stability and offset compensation may be further improved by using a DDA 201 in addition (or alternatively) to a multi auto-zeroed differential amplifier 202.

In particular, the use of a multi auto-zeroed amplifier 202 in conjunction with a DDA 201 allows for a continuous time regulation of the pass current with a high immunity to disturbances. The advantage of implementing a differential amplifier 202 with non-overlapped auto-zeroed sub-amplifiers 310, 320 that work in time division, allows removing errors that are caused by the aliasing of high frequency disturbances (e.g. at the commutation cycle rate of the power converter that provides the supply voltage 122). Another advantage is that the main regulation/sense loop gain remains constant, thereby avoiding pass current ripple at the auto-zero frequency.

Figure 5:
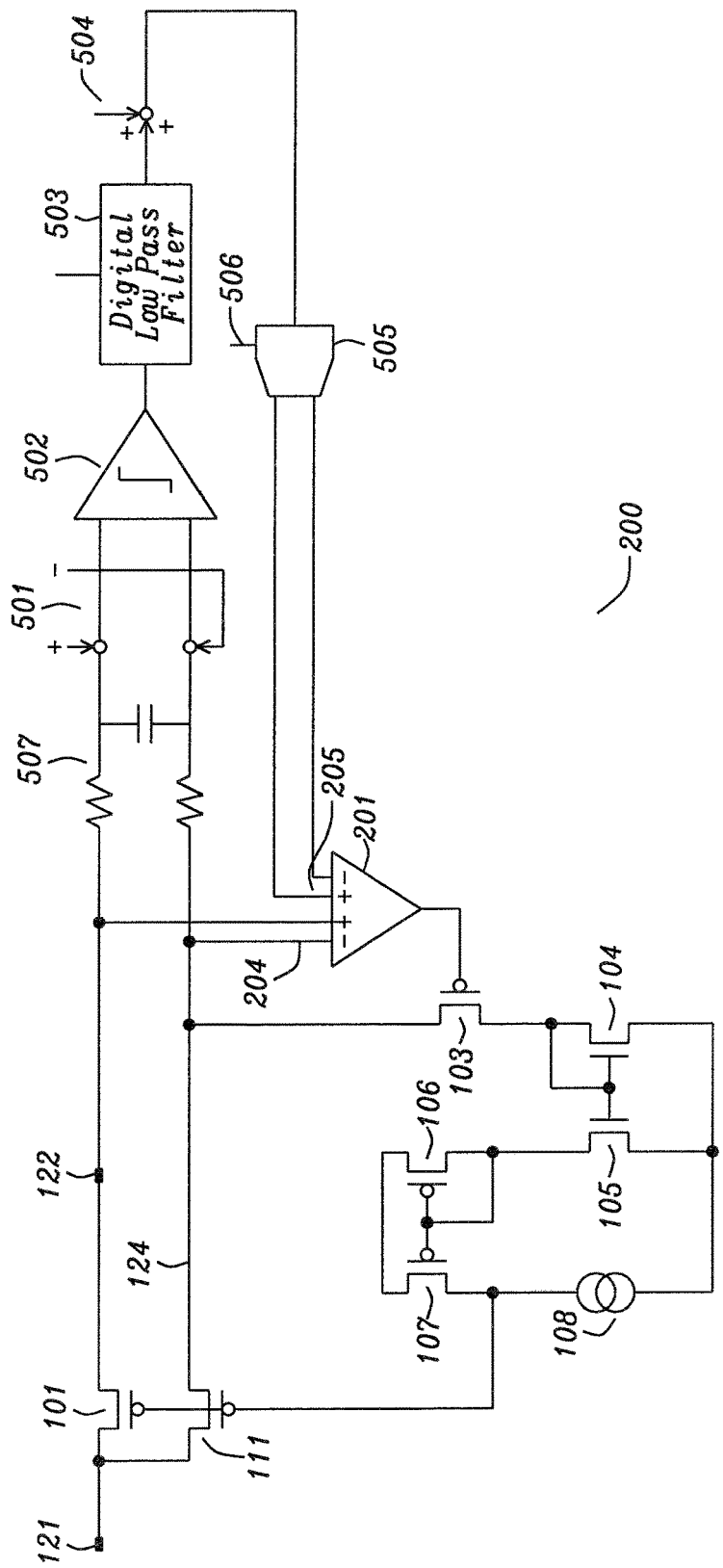
FIG. 5 shows a circuit diagram of a mixed signal sigma delta loop.

FIG. 5 shows a current sensing/regulation circuit 200 which makes use of a sigma delta ADC (analog-to-digital converter) 502 and a DAC (digital-to-analog converter) 505 within the control loop. Such a control loop provides increased flexibility as it allows changing the response bandwidth of a digital low pass filter 503 depending on the operation mode. Furthermore, a current offset 504 may be used. In addition, the offset may be measured and its value may be stored within a register. Subsequently, the sensing components may be shut down. The control loop of FIG. 5 also comprises an RC filter 507 for anti-aliasing. In view of the fact that the sigma delta ADC 502 typically cannot read a DC value, a relatively small dithering signal 501 with an average value equal to zero may be added at the input of the sigma delta ADC 502. In addition, the DAC 505 may be configured to apply a gain 506.

Figure 6:
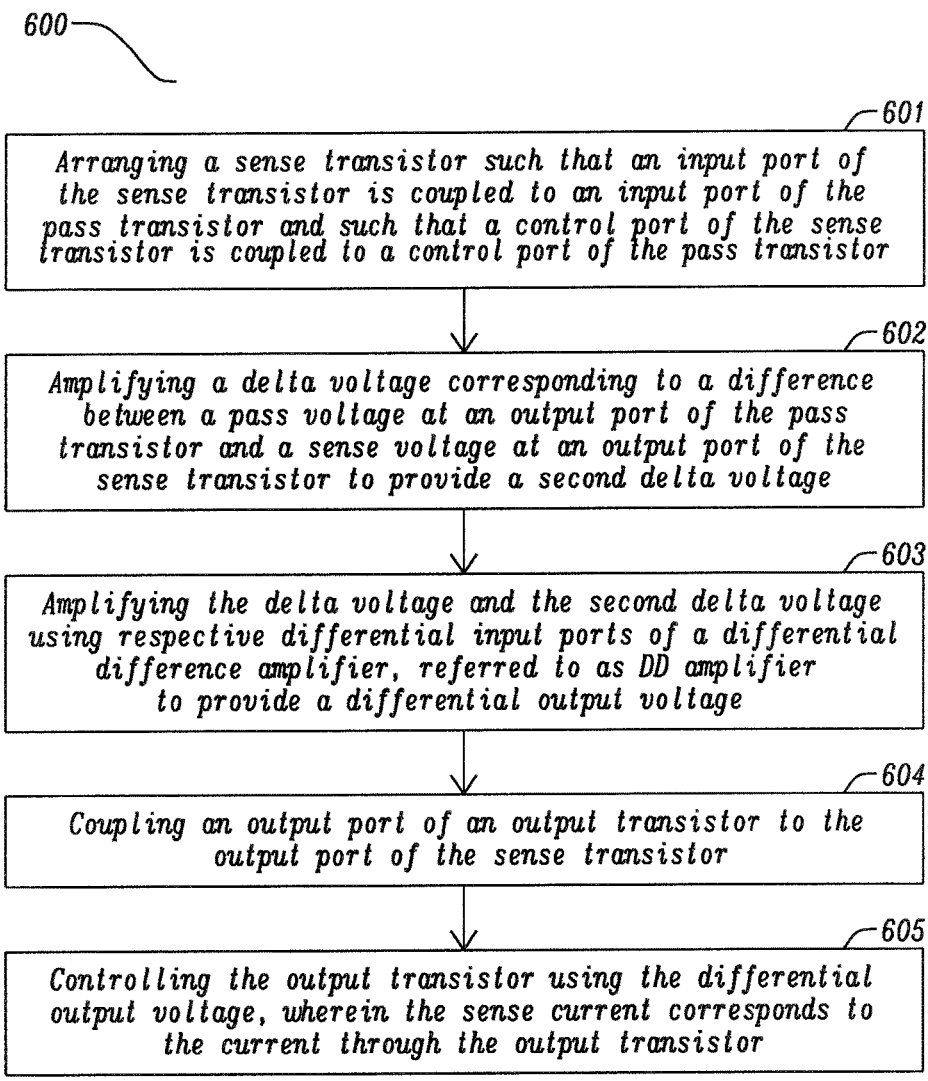
FIG. 6 shows a flow chart of a method for sensing the current through a pass transistor.

FIG. 6 shows a flow chart of an example method 600 for providing a sense current 123 which is indicative of a current through a pass transistor 101. The method 600 comprises arranging 601 a sense transistor 111 such that an input port (e.g. a source) of the sense transistor 111 is coupled to an input port (e.g. a source) of the pass transistor 101 and such that a control port (e.g. a gate) of the sense transistor 111 is coupled to a control port (e.g. a gate) of the pass transistor 101. Furthermore, the method 600 comprises amplifying 602 a delta voltage corresponding to a difference between a pass voltage 122 at an output port (e.g. a drain) of the pass transistor 101 and a sense voltage 124 at an output port (e.g. a drain) of the sense transistor 124 to provide a second delta voltage.

The method 600 further comprises amplifying 603 the delta voltage and the second delta voltage using respective differential input ports of a differential difference amplifier, referred to as DD amplifier, 201 to provide a differential output voltage. In addition, the method 600 comprises coupling 604 an output port (e.g. a drain) of an output transistor 103 to the output port (e.g. a drain) of the sense transistor 111. Furthermore, the method 600 comprises controlling 605 the output transistor 103 using the differential output voltage, wherein the sense current 123 corresponds to the current through the output transistor 103.

Figure 7A:
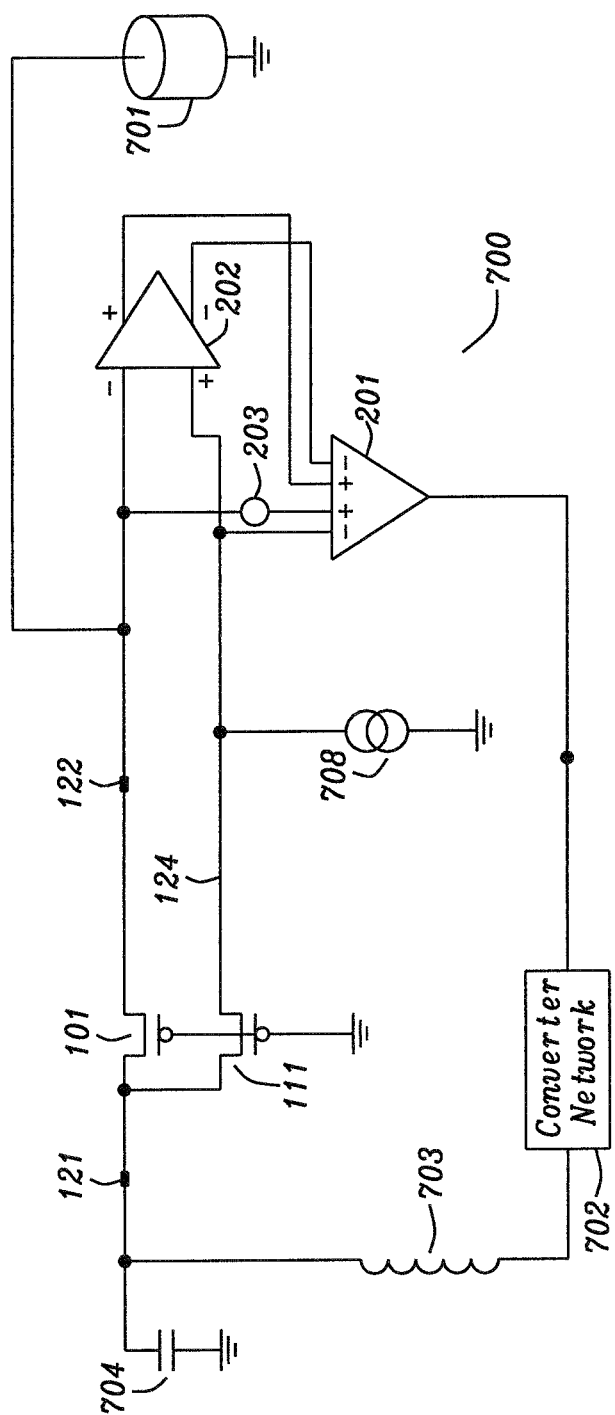
FIGS. 7a and 7b show circuit diagrams of example current sense circuit for a battery switch architecture.
Figure 7B:
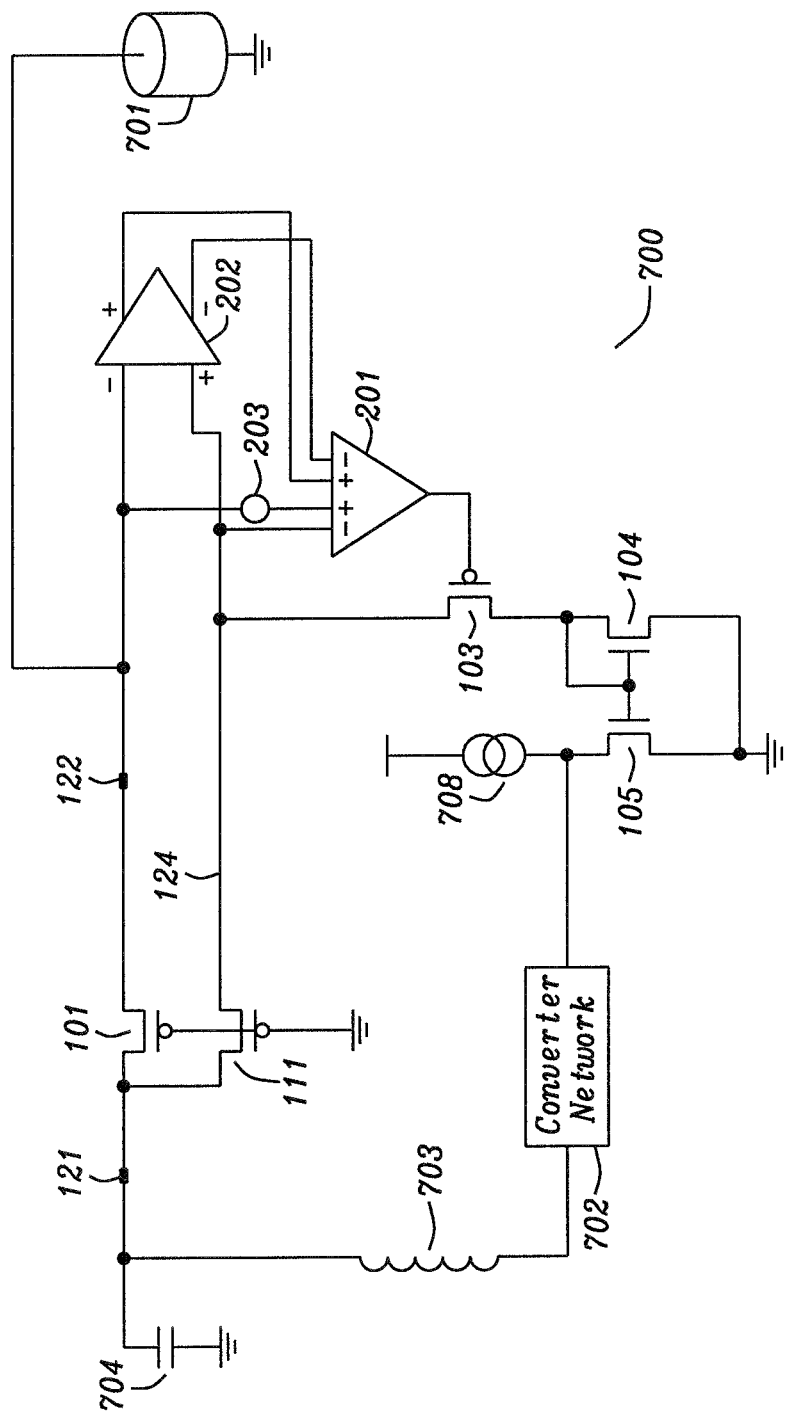

FIGS. 7a and 7b show how the offset compensation/auto-zeroing may be used within a battery switch architecture 700. In both circuit diagrams a constant current charging of a battery 701 is implemented. The current for charging the battery 701 is provided at the output of a DC-DC power converter 702, 703, 704 (e.g. a buck converter), which comprises a converter network 702, an inductor 703 and an output capacitor 704. The current for charging the battery is set by the control current source 708. In FIG. 7a, the control current source 708 provides a control current directly to the output of the sense transistor 111, in order to set the current through the sense transistor 111 (and in order to thereby set the current through the pass transistor 101). In FIG. 7b, the control current source 708 provides the control current to the output of the sense transistor 111 via a current mirror 104, 105 and via the output transistor 103.

The pass transistor 101 for a control loop for the power converter 702, 703, 704, and the control loop operates the power converter 702, 703, 704 to set the supply voltage 121 such that the desired current flows through the pass transistor 101. In both architectures, the output voltage 124 of the sense transistor 111 and the output voltage 122 of the pass transistor 101 are maintained at the same voltage using the precise auto-zeroing provided by the differential amplifier 202 and the DD amplifier 201.

In the circuit diagrams of FIGS. 7a and 7b, the gates of the pass transistor 101 and of the sense transistor 111 are tied to ground. As a result of this, the $V_{DS}$ of both transistors 101, 111 is typically substantially lower compared to a linear charger as illustrated in FIG. 2. Hence offset compensation is even more critical in the case of FIGS. 7a and 7b.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A current sense circuit for a pass transistor, wherein the current sense circuit comprises,
    a sense transistor having an input port that is coupled to an input port of the pass transistor and having a gate that is coupled to a gate of the pass transistor;
    a differential amplifier comprising a differential input and a differential output; wherein an output port of the pass transistor is coupled to a first port of the differential input and wherein an output port of the sense transistor is coupled to a second port of the differential input; and
    a differential difference amplifier, referred to as DD amplifier, comprising a main differential input, an auxiliary differential input and an output; wherein the differential output of the differential amplifier is coupled to the auxiliary differential input of the DD amplifier; wherein the output port of the pass transistor is coupled to a first port of the main differential input and wherein the output port of the sense transistor is coupled to a second port of the main differential input; wherein the output of the DD amplifier is used to control a voltage drop across the sense transistor and the pass transistor; and
    an output transistor which is controlled by the output of the DD amplifier; wherein an output port of the output transistor is coupled to the output port of the sense transistor; and wherein a sense current through the output transistor provides an indication of a current through the pass transistor,
    wherein the sense current through the output transistor is fed back to the gates of the pass transistor and of the sense transistor to control the voltage drop across the sense transistor and the pass transistor.

2. The current sense circuit of claim 1, further comprising a current source configured to set a control current; wherein a voltage level at the gates of the pass transistor and of the sense transistor is dependent on the control current.

3. The current sense circuit of any of claim 1, further comprising one or more current mirrors for mirroring the sense current to the gates of the pass transistor and of the sense transistor.

4. The current sense circuit of claim 1, wherein the differential amplifier comprises an offset compensated differential amplifier or an amplifier with a relatively low offset.

5. The current sense circuit of claim 1, wherein the differential amplifier comprises
    an analog-to-digital converter configured to derive a digital signal from the voltages at the differential input of the differential amplifier;
    a digital filter configured to filter the digital signal, to provide a filtered signal; and
    a digital-to-analog converter configured to derive voltages at the differential output of the differential amplifier based on the filtered signal.

6. The current sense circuit of claim 5, wherein the differential amplifier further comprises a dithering unit configured to apply a dither signal to the voltages at the differential input of the differential amplifier.

7. The current sense circuit of claim 1, wherein the differential amplifier comprises a first sub-amplifier and a second sub-amplifier that are arranged in parallel with regards to the differential input and the differential output of the differential amplifier.

8. The current sense circuit of claim 7, wherein the first sub-amplifier and the second sub-amplifier are operated in an auto-zero phase and in an amplification phase in an alternating manner.

9. The current sense circuit of claim 8, wherein the first sub-amplifier and the second sub-amplifier are operated in the auto-zero phase in a mutually exclusive manner, such that the first sub-amplifier is in the amplification phase, when the second sub-amplifier is in the auto-zero phase, and such that the second sub-amplifier is in the amplification phase, when the first sub-amplifier is in the auto-zero phase.

10. The current sense circuit of claim 8, wherein
the differential amplifier comprises auto-zero capacitors for the first sub-amplifier;
the auto-zero capacitors are arranged in series with an input port of the first sub-amplifier, when the first sub-amplifier is in the auto-zero phase; and
the auto-zero capacitors couple the input port of the first sub-amplifier to ground, when the first sub-amplifier is in the amplification phase.

11. The current sense circuit of claim 8, wherein the alternation of the auto-zero phase and of the amplification phase is controlled using a clock signal.

12. The current sense circuit of claim 1, wherein
the pass transistor, the sense transistor and the output transistor are metal oxide semiconductor transistors;
the input port of the pass transistor and of the sense transistor is a drain or a source; and
the output port of the pass transistor, of the sense transistor and of the output transistor is a source or a drain.

13. A method for providing a sense current which is indicative of a current through a pass transistor, the method comprising,
arranging a sense transistor such that an input port of the sense transistor is coupled to an input port of the pass transistor and such that a gate of the sense transistor is coupled to a gate of the pass transistor;
amplifying a delta voltage corresponding to a difference between a pass voltage at an output port of the pass transistor and a sense voltage at an output port of the sense transistor to provide a second delta voltage;
amplifying the delta voltage and the second delta voltage using respective differential input ports of a differential difference amplifier, referred to as DD amplifier, to provide a differential output voltage;
using an output of the DD amplifier to control a voltage drop across the sense transistor and the pass transistor; and
providing an output transistor which is controlled by the output of the DD amplifier, wherein an output port of the output transistor is coupled to the output port of the sense transistor; and wherein a sense current through the output transistor provides an indication of a current through the pass transistor
wherein the sense current through the output transistor is fed back to the gates of the pass transistor and of the sense transistor to control the voltage drop across the sense transistor and the pass transistor.

14. The method according to claim 13, further comprising the step of:
setting a control current by a current source; wherein a voltage level at the gates of the pass transistor and of the sense transistor is dependent on the control current.

15. The method according to claim 13, further comprising the step of:
mirroring by one or more current mirrors the sense current to the gates of the pass transistor and of the sense transistor.

16. The method according to claim 13, wherein the differential amplifier comprises an offset compensated differential amplifier or an amplifier with a relatively low offset.

17. The method according to claim 16, wherein using the differential amplifier comprises the steps of:
deriving with an analog-to-digital converter a digital signal from the voltages at the differential input of the differential amplifier;
filtering with a digital filter the digital signal, to provide a filtered signal; and
deriving with a digital-to-analog converter voltages at the differential output of the differential amplifier based on the filtered signal.

18. The method according to claim 17, wherein using the differential amplifier further comprising the step of:
applying with a dithering unit a dither signal to the voltages at the differential input of the differential amplifier.

19. The method according to claim 13, wherein the differential amplifier comprises a first sub-amplifier and a second sub-amplifier that are arranged in parallel with regards to the differential input and the differential output of the differential amplifier.

20. The method according to claim 19, wherein the first sub-amplifier and the second sub-amplifier are operated in an auto-zero phase and in an amplification phase in an alternating manner.

21. The method according to claim 20, wherein the first sub-amplifier and the second sub-amplifier are operated in the auto-zero phase in a mutually exclusive manner, such that the first sub-amplifier is in the amplification phase, when the second sub-amplifier is in the auto-zero phase, and such that the second sub-amplifier is in the amplification phase, when the first sub-amplifier is in the auto-zero phase.

22. The method according to claim 20, wherein
the differential amplifier comprises auto-zero capacitors for the first sub-amplifier;
the auto-zero capacitors are arranged in series with an input port of the first sub-amplifier, when the first sub-amplifier is in the auto-zero phase; and
the auto-zero capacitors couple the input port of the first sub-amplifier to ground, when the first sub-amplifier is in the amplification phase.

23. The method according to claim 20, wherein the alternation of the auto-zero phase and of the amplification phase is controlled using a clock signal.

24. The method according to claim 13, wherein
the pass transistor, the sense transistor and the output transistor are metal oxide semiconductor transistors;
the input port of the pass transistor and of the sense transistor is a drain or a source; and
the output port of the pass transistor, of the sense transistor and of the output transistor is a source or a drain.

* * * * *